United States Patent
Tanabe et al.

(10) Patent No.: US 9,067,234 B2
(45) Date of Patent: Jun. 30, 2015

(54) SUBSTRATE COATING DEVICE AND SUBSTRATE COATING METHOD

(75) Inventors: Masaaki Tanabe, Okayama (JP); Hideo Hirata, Okayama (JP); Mitsunori Oda, Okayama (JP)

(73) Assignee: TAZMO CO, LTD., Okayama (JP)

( * ) Notice: Subject to any disclaimer, the term of this patent is extended or adjusted under 35 U.S.C. 154(b) by 300 days.

(21) Appl. No.: 13/519,212

(22) PCT Filed: Jun. 3, 2010

(86) PCT No.: PCT/JP2010/059429
§ 371 (c)(1),
(2), (4) Date: Jun. 26, 2012

(87) PCT Pub. No.: WO2011/080933
PCT Pub. Date: Jul. 7, 2011

(65) Prior Publication Data
US 2012/0288635 A1    Nov. 15, 2012

(30) Foreign Application Priority Data
Dec. 28, 2009   (JP) ................................. 2009-298220

(51) Int. Cl.
*B05B 1/02* (2006.01)
*B05C 13/02* (2006.01)
(Continued)

(52) U.S. Cl.
CPC .............. *B05C 13/02* (2013.01); *B05C 5/0208* (2013.01); *B05C 5/0216* (2013.01); *B05C 5/0283* (2013.01); *B05C 5/0254* (2013.01); *H01L 21/6715* (2013.01); *H01L 21/6776* (2013.01)

(58) Field of Classification Search
CPC .... B05C 13/02; B05C 5/0283; B05C 5/0208; B05C 5/0216; H01L 21/6776; H01L 21/6715

USPC ................. 118/302, 304, 324, 425, 428, 696; 198/468.6, 468.8, 468.9
See application file for complete search history.

(56) References Cited

U.S. PATENT DOCUMENTS

| 4,605,569 A | * | 8/1986 | Shimada et al. | ............... 427/256 |
| 5,303,815 A | * | 4/1994 | Dooley | ......................... 198/680 |

(Continued)

FOREIGN PATENT DOCUMENTS

| JP | 61-220752 A | 10/1986 |
| JP | 09-192597 A | 7/1997 |

(Continued)

OTHER PUBLICATIONS

International Search Report for corresponding International Application No. PCT/JP2010/059429 mailed Aug. 31, 2010.

*Primary Examiner* — Laura Edwards
(74) *Attorney, Agent, or Firm* — Renner, Otto, Boisselle & Sklar, LLP

(57) ABSTRACT

A substrate coating device (10) includes a precision stage (7), a nozzle (8), and conveyors (3 to 6 and 21). The precision stage (7) has a horizontal placement surface for placing a substrate W thereon and is configured to be reciprocable between an upstream end and a downstream end in a conveying direction. The conveyors (3 to 6 and 21) are configured to convey the substrate W in the conveying direction via the placement surface of the precision stage (7) in such manner that a surface of the substrate W is positioned in a horizontal plane. The intermediate conveyor (21) is liftable between a conveying position where a conveying surface of the intermediate conveyor is coincident with the placement surface of the stage and a non-conveying position where the conveying surface is positioned below the placement surface of the stage.

2 Claims, 5 Drawing Sheets

(51) Int. Cl.
*H01L 21/67* (2006.01)
*H01L 21/677* (2006.01)
*B05C 5/02* (2006.01)

(56) References Cited

U.S. PATENT DOCUMENTS 5,853,812 A * 12/1998 Kawasaki et al. ............ 427/424
6,217,652 B1 * 4/2001 Okubo et al. ................. 118/66
6,319,316 B1 * 11/2001 Gibson et al. ................ 118/50
7,111,390 B2 * 9/2006 Shimamura et al. .......... 29/791

FOREIGN PATENT DOCUMENTS

| JP | 2004-298775 A | 10/2004 |
| JP | 2007-173365 A | 7/2007 |
| JP | 2008-166478 A | 7/2008 |

* cited by examiner

SUBSTRATE COATING DEVICE AND SUBSTRATE COATING METHOD

TECHNICAL FIELD

The present invention relates to a substrate coating device configured to coat a to-be-coated surface of a plate-shaped substrate, such as a glass substrate, with a coating liquid, such as a resist liquid, by scanning a nozzle relative to the substrate in one direction while delivering the coating liquid onto the to-be-coated surface of the substrate.

BACKGROUND ART

When coating a surface of a plate-shaped substrate, such as a glass substrate, with a coating liquid, use is made of a substrate coating device configured to scan a slit nozzle relative to the surface of the substrate in a predetermined scanning direction perpendicular to the slit with a spacing kept between the slit nozzle and the surface of the substrate.

In improving the productivity of large-sized substrates, an arrangement is conceivable which is configured to convey a plurality of substrates sequentially to a coating position at which a nozzle is disposed by means of a conveyor and then convey each of the substrates having been subjected to coating to the next processing position.

In order to coat the surface of the substrate with a desired thickness of the coating liquid uniformly, the spacing between the tip of the nozzle and the surface of the substrate needs to be kept constant. For this purpose, a precision stage having a smooth top surface is disposed at the coating position. A substrate placed on the precision stage is subjected to coating with the coating liquid delivered from the nozzle.

Among conventional substrate coating devices, there is one which has an arrangement in which a rail for moving a slit nozzle is disposed at a coating position at which is disposed a precision stage called a "placement stage" in such a manner as to extend perpendicular to the substrate conveying direction without the possibility of interference with substrates (see patent literature 1 for example).

In the arrangement described in patent literature 1, the slit nozzle is disposed in such a manner that its longitudinal direction extends parallel with the substrate conveying direction, so that the slit nozzle moves along the rail in the direction perpendicular to the substrate conveying direction, relative to a substrate having been conveyed onto the precision stage.

CITATION LIST

Patent Literature

Patent Literature 1: Japanese Patent Laid-Open Publication No. 2004-298775

SUMMARY OF INVENTION

Technical Problem

The substrate coating device described in patent literature 1, however, is incapable of moving the substrate in the conveying direction during coating because the nozzle moves in the direction perpendicular to the substrate conveying direction relative to the substrate which has stopped moving in the conveying direction at the coating position. This causes the takt time in coating operation to be prolonged.

Even when a conveyor robot or inter-unit conveyor mechanism is provided at the coating position where the precision stage is disposed, the substrate has to stop moving during coating, which results in a prolonged takt time in coating operation.

An object of the present invention is to provide a substrate coating device which is capable of coating the surface of a substrate with the coating liquid while moving the substrate along a conveying path, thereby shortening the takt time in coating operation.

Solution to Problem

A substrate coating device according to the present invention includes a stage, a nozzle, a conveyor, stage moving means, nozzle lifting means, conveyor lifting means, and control means. The stage has a horizontal placement surface for placing a substrate thereon and is configured to be reciprocable between an upstream end and a downstream end in a conveying direction. The conveyor is configured to convey the substrate in the predetermined conveying direction via the placement surface of the stage in such a manner that a surface of the substrate is positioned in a horizontal plane, the conveyor including a liftable intermediate portion having at least a length of a predetermined range. The stage moving means is configured to reciprocate the stage between an upstream end and a downstream end in the predetermined range. The conveyor lifting means is configured to lift up and down the intermediate portion of the conveyor between a conveying position where a conveying surface of the intermediate portion is coincident with the placement surface of the stage and a non-conveying position where the conveying surface is positioned below the placement surface of the stage. The control means is configured to control operations of the stage moving means and the conveyor lifting means in such a manner as to allow the nozzle to deliver a coating liquid onto the surface of the substrate during movement of the stage carrying the substrate having been conveyed and placed onto the placement surface thereof by the conveyor from the upstream end to the downstream end.

Advantageous Effects of Invention

The present invention makes it possible to coat the surface of a substrate without stopping the movement of the substrate in the substrate conveying direction, thereby to shorten the takt time in coating operation.

DESCRIPTION OF EMBODIMENTS

Hereinafter, a substrate coating device according to an embodiment of the present invention will be described with reference to the drawings.

Figure 1:
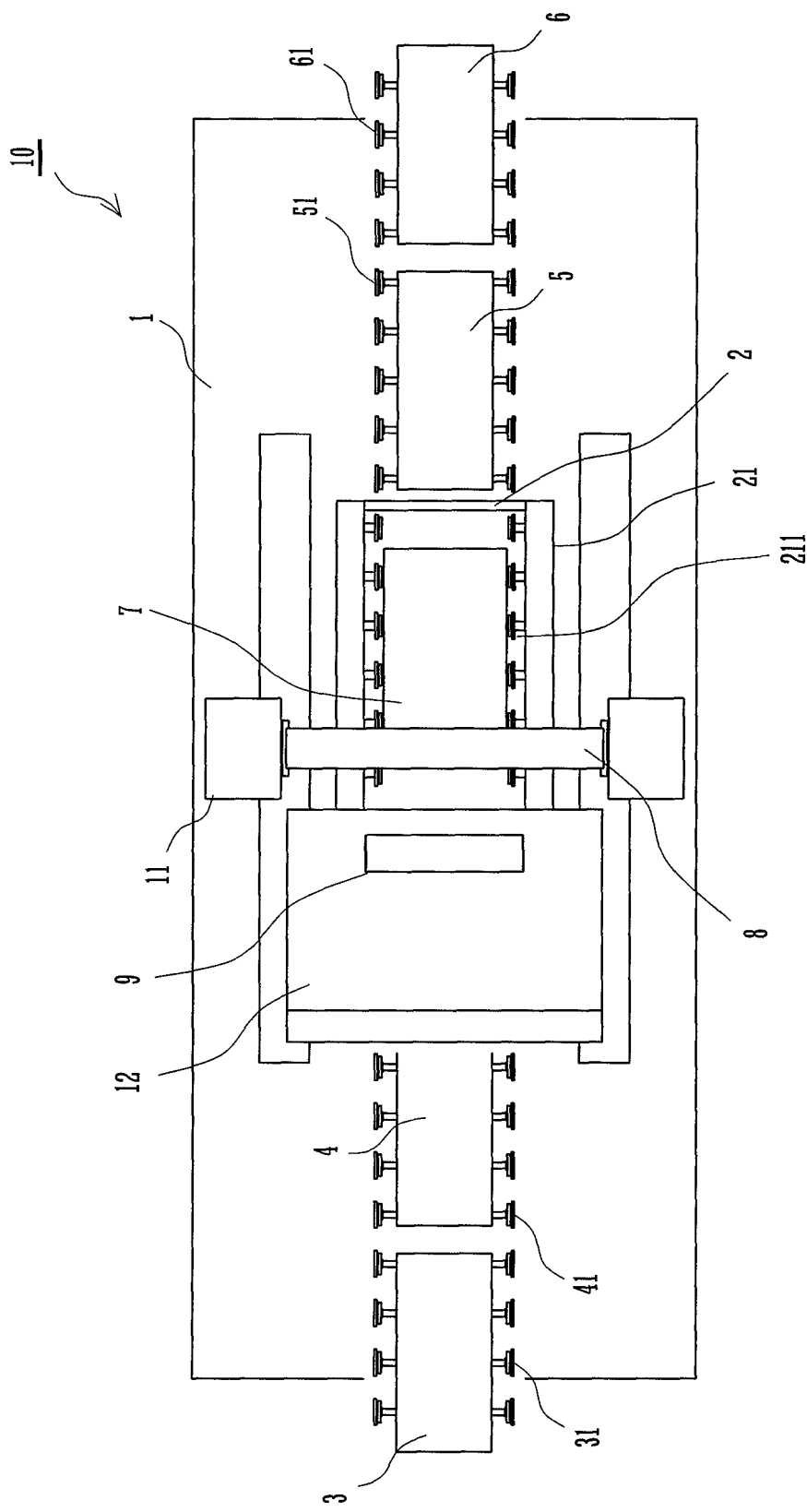
FIG. 1 is a plan view illustrating a substrate coating device according to an embodiment of the present invention.
Figure 2:
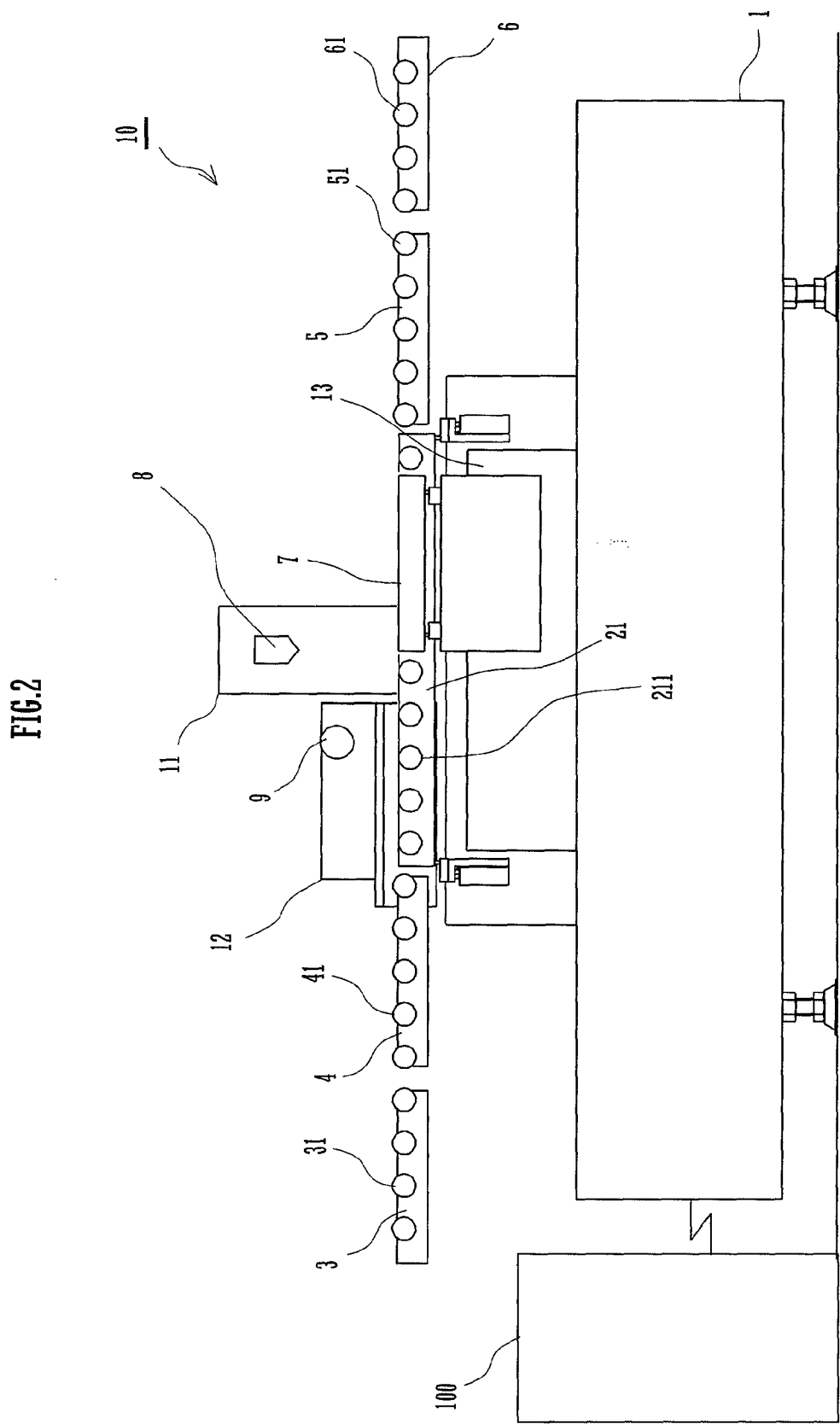
FIG. 2 is a front elevational view of the substrate coating device.

As illustrated in FIGS. 1 and 2, a substrate coating device 10 according to an embodiment of the present invention includes a mainframe 1, a subframe 2, a first upstream side conveyor 3, a second upstream side conveyor 4, a first downstream side conveyor 5, a second downstream side conveyor 6, a precision stage 7, a nozzle 8, a priming roller 9, and a control section 100.

The mainframe 1 has a top surface holding the subframe 2, first upstream side conveyor 3, second upstream side conveyor 4, first downstream side conveyor 5 and second downstream side conveyor 6. The mainframe 1 also holds the nozzle 8 and the priming roller 9 by means of support members 11 and 12. A rail 13 is disposed on the top surface of the mainframe 1.

The subframe 2 is liftably held on the mainframe 1 and supports an intermediate conveyor 21. The intermediate conveyor 21 is equivalent to the "intermediate portion of a conveyor" defined by the present invention and comprises a plurality of rollers 211.

The first upstream side conveyor 3, second upstream side conveyor 4, first downstream side conveyor 5 and second downstream side conveyor 6, together with the intermediate conveyor 21, form the "conveyor" defined by the present invention. The conveyors 3 to 6 comprise plural rollers 31, plural rollers 41, plural rollers 51 and plural rollers 61, respectively. The conveyors 3 to 6 and the intermediate conveyor 21 convey a substrate linearly from the upstream side toward the downstream side. The rollers 31, 41, 51, 61 and 211 come into contact with opposite edge portions of the bottom surface of the substrate which extend parallel with a conveying direction. The substrate conveying direction is coincident with the longitudinal direction of the rail 13.

Each of the conveyors 3 to 6 and 21 is not limited to a roller hearth comprising the plural rollers 31, 41, 51, 61 or 211. Use may be made of any suitable mechanism for conveying a substrate using a belt, chain or the like.

The precision stage 7, which is equivalent to the "stage" defined by the present invention, is configured to be reciprocable within a predetermined range between an upstream end and a downstream end in the longitudinal direction of the rail 13. The precision stage has a smooth horizontal top surface for placing the substrate thereon. The predetermined range within which the precision stage 7 is reciprocable is set in the subframe so as to extend in the substrate conveying direction. The precision stage 7 may be configured to attract the substrate on its top surface.

The nozzle 8 is configured to deliver a coating liquid from a slit which is open at the bottom of the nozzle 8. The nozzle 8 is supported above the precision stage 7 by the support member 11 so as to be liftable between a delivery position and a retreated position. The nozzle 8 is positioned in such a manner that the longitudinal direction of the slit is perpendicular to the substrate conveying direction in a horizontal plane.

The priming roller 9, which is equivalent to the "cleaning member" defined by the present invention, is configured to rotate with its peripheral surface abutting against the slit of the nozzle 8. A priming unit 12 together with a priming roller motor causes the priming roller 9 to reciprocate above the precision stage 7 between a cleaning position and a standby position in the substrate conveying direction. The priming roller 9 as the cleaning member is provided to stabilize the state of delivery of the coating liquid by the nozzle 8 and hence can be eliminated on condition that the coating solution can be stably delivered from the nozzle onto the entire surface of the substrate.

Figure 3:
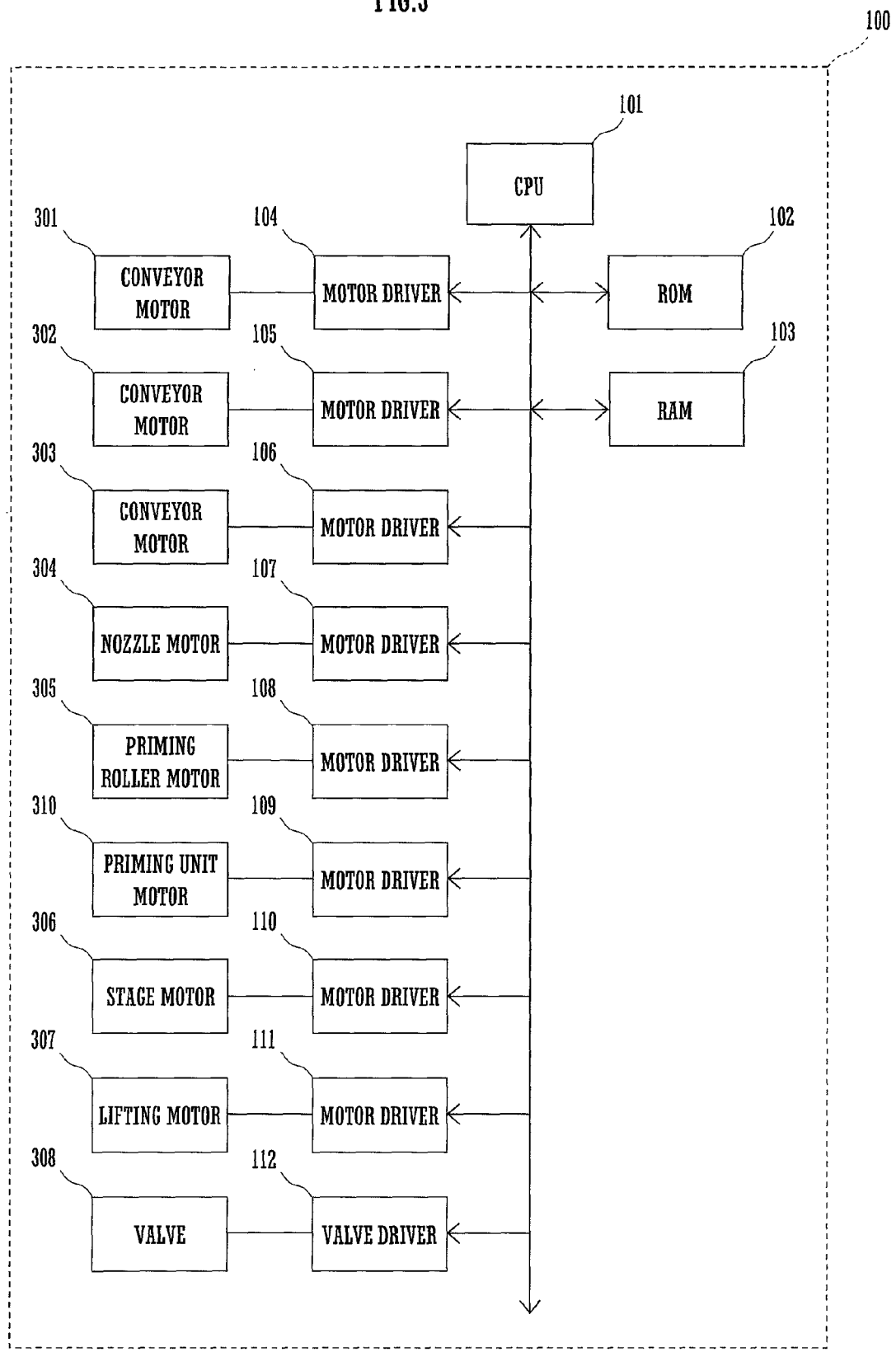
FIG. 3 is a block diagram illustrating a control section of the substrate coating device.

As illustrated in FIG. 3, the control section 100 includes a CPU 101 provided with ROM 102 and RAM 103, and motor drivers 104 to 111 and a valve driver 112 which are connected to the CPU 101. The control section 100, which is equivalent to the "control section" defined by the present invention, is housed in a box disposed at a location clear of the mainframe 1. The CPU 101 outputs drive data to the motor driver 104 to 111 and the valve driver 112 according to programs stored in the ROM 102. Data inputted and outputted during this operation is temporarily stored in the RAM 103.

The motor drivers 104 to 111 are connected to conveyor motors 301 to 303, a nozzle motor 304, a priming roller motor 305, a priming unit motor 310, a stage motor 306, and a subframe lifting motor 307, respectively, while the valve driver 112 connected to a coating liquid valve 308.

The nozzle motor 304, stage motor 306 and subframe lifting motor 307 are equivalent to the "nozzle lifting means", "stage moving means", and "conveyor lifting means", respectively, which are defined by the present invention. Each of the nozzle lifting means, stage moving means and conveyor lifting means is not limited to a motor, but any desired driving source, such as an air cylinder or a linear motor, may be used.

Figure 4:
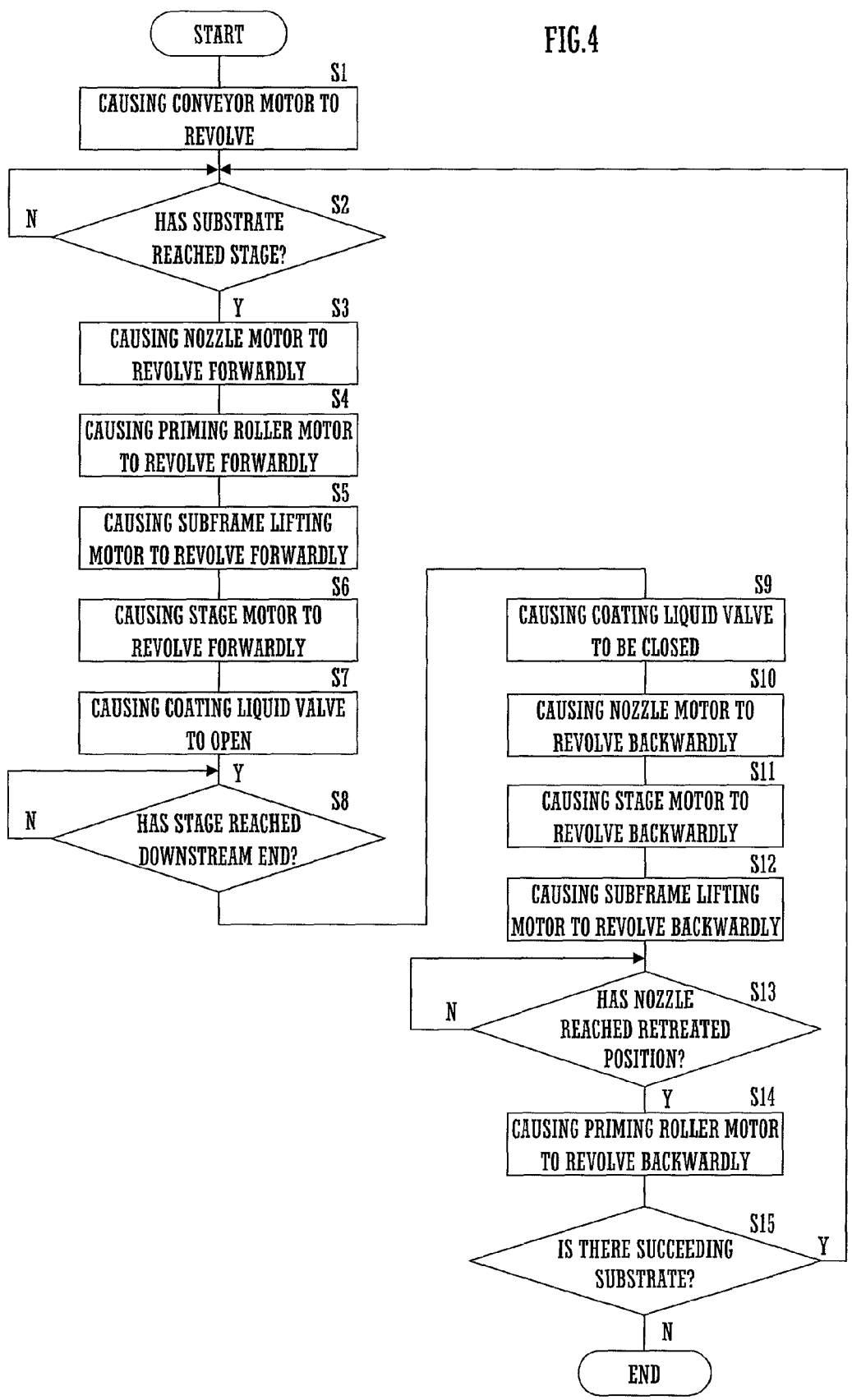
FIG. 4 is a flowchart of a process carried out by the control section.

As illustrated in FIG. 4, the CPU 101 outputs drive signals to the motor drivers 104 to 106 at the time of coating operation to cause the conveyor motors 301 to 303 to revolve at a predetermined substrate conveying speed (step S1). Thus, the rollers 31, 41, 51, 61 and 211 start rotating to convey a substrate W in the substrate conveying direction indicated by arrow X, as shown in FIG. 5A.

Figure 5A:
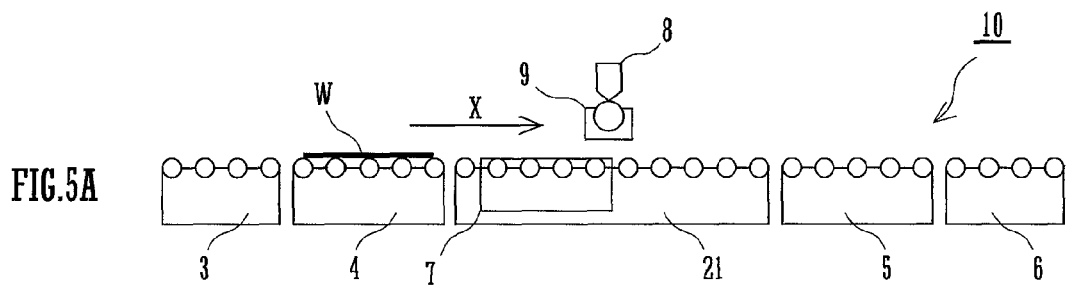
FIGS. 5A to 5E are views illustrating a substrate coating method according to the present invention.

As illustrated in FIG. 5A, at the start of coating operation the subframe 2 assumes a conveying position where the conveying surface of the intermediate conveyor 21 is coincident with the conveying surfaces of the conveyors 3 to 6 in the vertical direction. The precision stage 7 is positioned at the upstream end in the arrow X direction. The nozzle 8 is in the retreated position spaced apart from the substrate W. The priming roller 9 is in the cleaning position where the priming roller 9 abuts against the slit of the nozzle 8. The position of the nozzle 8 in the arrow X direction is substantially coincident with the downstream side edge of the precision stage 7 positioned at the upstream end.

Figure 5B:
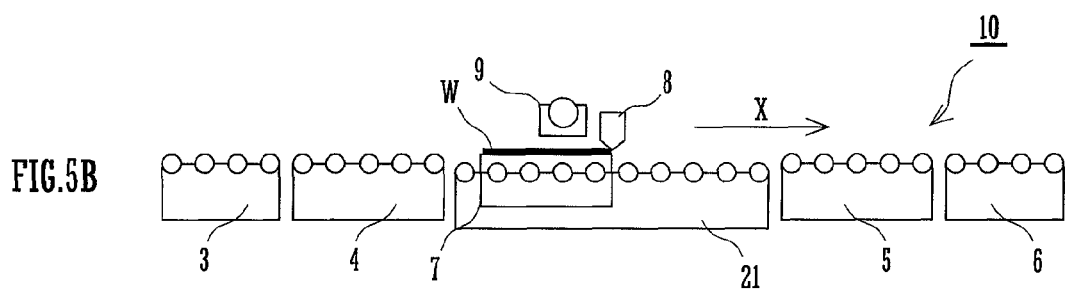

When the leading edge of the substrate W reaches the downstream side edge of the precision stage 7 (step S2), the CPU 101 outputs drive signals to the motor drivers 107, 109 and 111 to cause the nozzle motor 304, priming unit motor 310 and subframe lifting motor 307 to revolve forwardly by respective predetermined amounts (steps S3 to S5). This causes the priming unit 12 including the priming roller 9 to move into a retreated position and makes the nozzle 8 descend into the coating position while lowering the subframe 2 into a non-conveying position, as shown in FIG. 5B.

The CPU 101 further outputs drive signals to the motor driver 110 and the valve driver 112 to cause the stage motor 306 to revolve forwardly (step S6) and open the coating liquid valve 308 (step S7). This causes the precision stage 7 to start moving from the upstream end toward the downstream end in the arrow X direction while allowing the coating solution to be delivered from the nozzle 8. With the nozzle 8 in the coating position, the slit of the nozzle 8 and the top surface of the substrate W define therebetween an optimal spacing for coating with the coating liquid. With the substrate W placed on the smoothed top surface of the precision stage 7, the entire surface of the substrate W is uniformly coated with the coating liquid delivered from the nozzle 8.

Figure 5C:
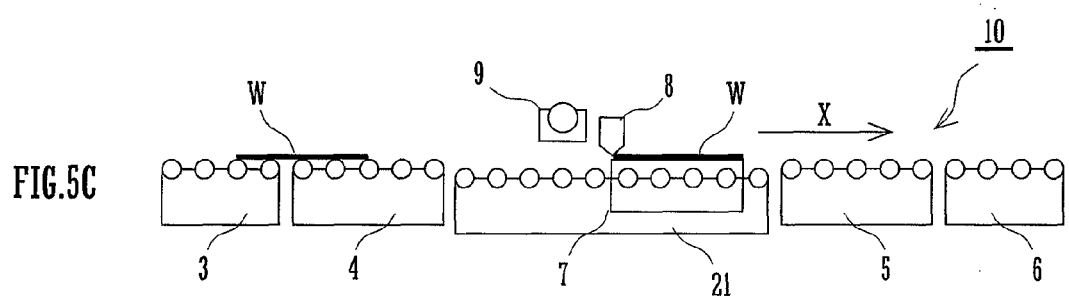
Figure 5D:
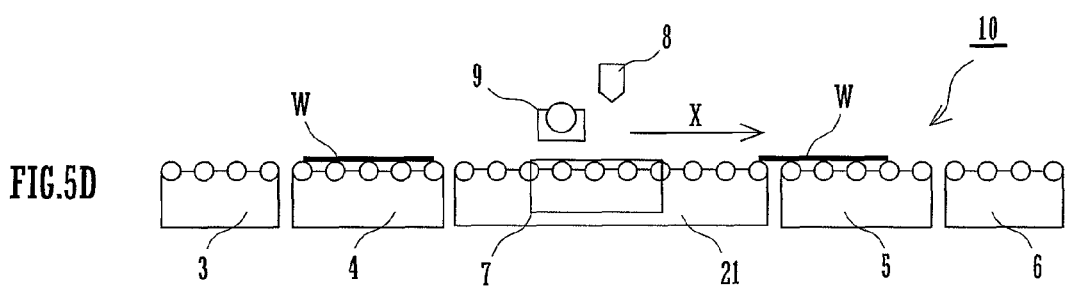
Figure 5E:
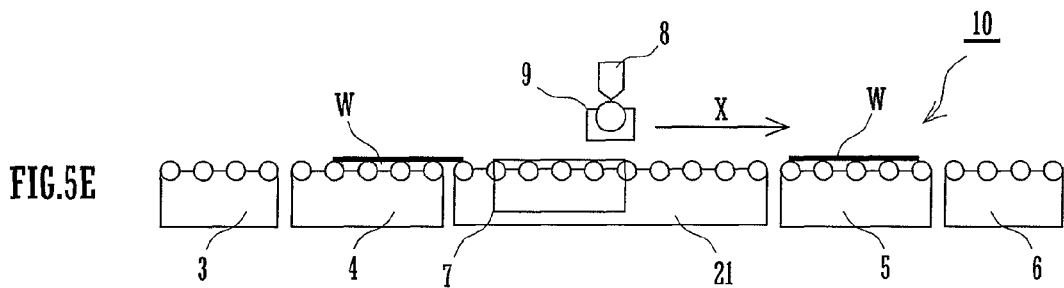

When the precision stage 7 reaches the downstream end while the trailing edge of the substrate W reaches the slit position of the nozzle 8 (step S8) as shown in FIG. 5C, the CPU 101 outputs a drive signal to the valve driver 112 to close the coating liquid valve (step S9). Further, the CPU 101 outputs drive signals to the motor drivers 107, 108 and 111 to cause the nozzle motor 304, stage motor 306 and subframe lifting motor 307 to revolve backwardly by respective predetermined amounts (steps S10 to S12). This causes the nozzle 8 to ascend into the retreated position and makes the precision stage 7 move toward the upstream end while causing the subframe 2 to ascend into the conveying position, as shown in FIG. 5D. Further, after the nozzle 8 has reached the retreated position (step S13), the CPU 101 outputs a drive signal to the motor driver 109 to cause the priming unit motor 310 to revolve backwardly by a predetermined amount (step S14). This causes the priming unit 12 including the priming roller 9 to move into the cleaning position, as shown in FIG. 5E. The CPU 101 drives the priming roller motor 305 by means of the motor driver 108 to cause the priming roller 9 to rotate, thereby to clean the nozzle 8.

The CPU 101 performs the steps S2 to S14 repeatedly until substrates W to be subjected to coating are exhausted (step S15), thus coating plural substrates W with the coating liquid sequentially.

The substrates W are positioned as spaced apart from each other in order to prevent, after completion of coating of one substrate W, the leading edge of the succeeding substrate W from reaching the position in the arrow X direction where the nozzle 8 is placed during movement of the precision stage 7 from the downstream end to the upstream end. By so doing, the plural substrates W can be sequentially coated with the coating liquid without the need to stop conveying the substrates W, thereby shortening the takt time in coating operation.

The foregoing embodiment should be construed to be illustrative and not limitative of the present invention in all the points. The scope of the present invention is defined by the following claims, not by the foregoing embodiment. Further, the scope of the present invention is intended to include the scopes of the claims and all possible changes and modifications within the senses and scopes of equivalents.

REFERENCE SIGNS LIST

1 mainframe
2 subframe
3 first upstream side conveyor
4 second upstream side conveyor
5 first downstream side conveyor
6 second downstream side conveyor
7 precision stage
8 nozzle
9 priming roller
10 substrate coating device
100 control section
W substrate

The invention claimed is:

1. A substrate coating device comprising:
a stage having a horizontal placement surface for placing a substrate thereon and configured to be reciprocable within a predetermined range in a conveying direction;
a nozzle having a slit for delivering a coating liquid downwardly which extends perpendicular to the conveying direction, the nozzle being vertically reciprocable above the stage;
a conveyor configured to convey the substrate in the conveying direction via the placement surface in such manner that a surface of the substrate is positioned in a horizontal plane, the conveyor including a liftable intermediate portion having at least a length of the predetermined range;
stage moving means configured to reciprocate the stage between an upstream end and a downstream end in the predetermined range;
a conveyor lifting means configured to lift up and down the intermediate portion of the conveyor between a conveying position where a conveying surface of the intermediate portion is coincident with the placement surface and a non-conveying position where the conveying surface is positioned below the placement surface;
a control section configured to control operations of the stage moving means and the conveyor lifting means in such a manner as to allow the nozzle to deliver the coating liquid onto the surface of the substrate during movement of the stage carrying the substrate having been conveyed and placed onto the placement surface thereof by the conveyor from the upstream end to the downstream end;
nozzle lifting means configured to lift up and down the nozzle between an optimal delivery position for delivering the coating liquid onto the surface of the substrate placed on the placement surface and a retreated position above the delivery position;
a cleaning member as cleaning means configured to clean the slit of the nozzle, the cleaning member being reciprocable in the conveying direction; and
cleaning member moving means configured to move the cleaning member between a cleaning position where the cleaning member abuts against the nozzle and a standby position where the cleaning member fails to abut against the nozzle;
wherein:
the control section controls the operation of the stage moving means to cause the stage carrying the substrate placed on the placement surface to move forward from the upstream end toward the downstream end and then cause the stage carrying no substrate on the placement surface to move backward from the downstream end toward the upstream end while controlling the operation of the conveyor lifting means to cause the intermediate portion of the conveyor to descend into the non-conveying position when the substrate reaches a position above the stage positioned at the upstream end and then cause the intermediate portion to ascend into the conveying position when the stage carrying the substrate placed on the placement surface reaches the downstream end;
the control section controls an operation of the nozzle lifting means to cause the nozzle to descend into the delivery position after the intermediate portion of the conveyor has descended into the non-conveying position and then cause the nozzle to ascend into the retreated position when the stage carrying the substrate placed on the placement surface reaches the downstream end; and
the control section operates the cleaning member moving means to cause the cleaning member to move into the cleaning position when the nozzle ascends from the coating position to the retreated position and then cause the cleaning member to move into the standby position before the nozzle moves from the retreated position to the coating position.

2. The substrate coating device according to claim 1, wherein the conveyor comes into contact with portions of the substrate adjacent opposite side edges of the substrate which extend parallel with the conveying direction.

* * * * *